(12) United States Patent
Gao et al.

(10) Patent No.: US 9,313,887 B2
(45) Date of Patent: Apr. 12, 2016

(54) CONDUCTIVE FILM, MANUFACTURING METHOD THEREOF, AND TOUCH SCREEN HAVING THE SAME

(71) Applicant: NANCHANG O-FILM TECH. CO., LTD., Nanchang (CN)

(72) Inventors: Yulong Gao, Nachang (CN); Zheng Cui, Suzhou (CN); Chao Sun, Nanchang (CN)

(73) Assignee: Nanchang O-Film Tech. Co., Ltd., Nanchang, Jiangxi (CN)

( * ) Notice: Subject to any disclaimer, the term of this patent is extended or adjusted under 35 U.S.C. 154(b) by 230 days.

(21) Appl. No.: 14/000,131

(22) PCT Filed: Jul. 6, 2013

(86) PCT No.: PCT/CN2013/078946
§ 371 (c)(1),
(2) Date: Aug. 16, 2013

(87) PCT Pub. No.: WO2014/121584
PCT Pub. Date: Aug. 14, 2014

(65) Prior Publication Data
US 2014/0253827 A1  Sep. 11, 2014

(30) Foreign Application Priority Data
Feb. 6, 2013 (CN) .......................... 2013 1 0048421

(51) Int. Cl.
*G06F 3/041* (2006.01)
*H05K 1/02* (2006.01)
*H05K 3/46* (2006.01)
*G06F 3/044* (2006.01)

(52) U.S. Cl.
CPC .............. *H05K 1/0298* (2013.01); *G06F 3/044* (2013.01); *H05K 3/4644* (2013.01); *G06F 2203/04103* (2013.01); *Y10T 428/2495* (2015.01)

(58) Field of Classification Search
CPC .......... G06F 3/044; G06F 2203/04103; H05K 1/0298; H05K 3/4644; H05K 1/0296; H05K 1/0287; H05K 2201/09681; H05K 2201/0108; H05K 1/092; Y10T 428/2495
USPC ...................... 345/156–184; 178/18.01–20.04
See application file for complete search history.

(56) References Cited

U.S. PATENT DOCUMENTS 9,013,448 B2 * 4/2015 Miyamoto et al. ............ 345/174
2005/0034755 A1 2/2005 Okada et al.
(Continued)

FOREIGN PATENT DOCUMENTS

| CN | 201489234 U | 5/2010 |
| CN | 102722279 A | 10/2012 |

(Continued)

OTHER PUBLICATIONS

International search report, International application No. PCT/CN2013/078946. Date of mailing: Nov. 14, 2013. SIPO, Beijing, CN.

*Primary Examiner* — Kent Chang
*Assistant Examiner* — Nelson Rosario
(74) *Attorney, Agent, or Firm* — Coats & Bennett, P.L.L.C.

(57) ABSTRACT

A conductive film includes a substrate, a first matrix layer, a first conductive layer, a second matrix layer, and a second conductive layer. The substrate includes a first surface and an oppositely arranged second surface. The first matrix layer is attached to the first surface. The first conductive layer is embedded in the first matrix layer. The second matrix layer is attached to a side of the first matrix layer away from the substrate. The second conductive layer is embedded in the second matrix layer. Due to the capacitor formed between the first conductive layer and the second conductive layer, it just needs to attach the conductive film to a glass panel when the conductive film is adopted to manufacture a touch screen, without bonding two pieces of conductive films.

19 Claims, 8 Drawing Sheets

(56) References Cited

U.S. PATENT DOCUMENTS

| | | | |
|---|---|---|---|
| 2008/0138589 A1* | 6/2008 | Wakabayashi et al. | 428/195.1 |
| 2009/0085885 A1* | 4/2009 | Wu et al. | 345/173 |
| 2010/0245370 A1* | 9/2010 | Narayanan et al. | 345/522 |
| 2012/0098788 A1* | 4/2012 | Sekiguchi | 345/174 |
| 2012/0293430 A1 | 11/2012 | Kitada | |
| 2014/0116754 A1 | 5/2014 | Gao et al. | |

FOREIGN PATENT DOCUMENTS

| | | |
|---|---|---|
| CN | 102903423 A | 1/2013 |
| CN | 103106953 A | 5/2013 |
| CN | 103187119 A | 7/2013 |
| JP | 2010287090 A | 12/2010 |
| JP | 2012094115 A | 5/2012 |
| JP | 2012519329 A | 8/2012 |
| JP | 2012243058 A | 12/2012 |
| KR | 20110137550 A | 12/2011 |
| KR | 20120018059 A | 2/2012 |
| KR | 20120121573 A | 11/2012 |
| TW | 200306014 A | 11/2003 |
| TW | 201224903 A | 6/2012 |
| WO | 2010099132 A2 | 9/2010 |
| WO | 2011062301 A1 | 5/2011 |

* cited by examiner

CONDUCTIVE FILM, MANUFACTURING METHOD THEREOF, AND TOUCH SCREEN HAVING THE SAME

FIELD OF THE DISCLOSURE

The present disclosure relates to electronic technology, and more particularly relates to a conductive film, method for manufacturing the conductive film, and a touch screen having the conductive film.

BACKGROUND OF THE DISCLOSURE

Conductive film is a kind of film with good electrical conductivity and flexibility, which for now is mainly applied in touch screen filed and etc., and has great market space. A conventional conductive film comprises a substrate and a conductive layer formed on the substrate. The conductive layer is formed on the substrate by coating, spraying, or other processes. When this kind of conductive film is used in practical application, two pieces of conductive films are attached together with adhesive for special usage, such as electromagnetic screen film, touch-sensitive film, etc.

For example, in touch screen of mobile phone, two pieces of conductive films are attached together with optically transparent adhesive. A specific area of a conductive film is overlapped with a specific area of the other conductive film, forming a structure similar to a capacitor. When one of the conductive films is approached by a finger or a touch-controlled pen, capacity variation of the overlapped area is thereby caused to implement perception of the touch position and performance of touch instruction.

To sum up, the conventional conductive film needs to be attached together with two pieces after forming, before practical application. Due to the thickness of the substrate and the thickness of the transparent adhesive, the conventional conductive film result in the touch screen with a relatively greater thickness, which is unfavorable to lightening and thinning development of electronic products.

SUMMARY OF THE DISCLOSURE

The present disclosure is directed to provide a conductive film which effectively reduces thickness of touch screen, a method for manufacturing the conductive film, and a touch screen including the conductive film.

According to an aspect of the present disclosure, a conductive film is provided. The conductive film includes:
   a substrate comprising a first surface and a second surface opposite to the first surface;
   a first matrix layer disposed on the first surface, the first matrix layer being formed by solidified gel coating;
   a first conductive layer embedded in the first matrix layer, a thickness of the first conductive layer being less than a thickness of the first matrix layer;
   a second matrix layer disposed on a side of the first matrix layer away from the substrate, the second matrix layer being formed by solidified gel coating; and
   a second conductive layer embedded in the second matrix layer, a thickness of the second conductive layer being less than a thickness of the second matrix layer;
   wherein the second conductive layer is insulated from the first conductive layer.

In a preferred embodiment, a total thickness of the first matrix layer and the second matrix layer is less than a thickness of the substrate, and a spacing distance between the first conductive layer and the second conductive layer is less than the thickness of the substrate.

In a preferred embodiment, the first matrix layer defines a first groove on a side thereof away from the substrate, the second matrix layer defines a second groove on a side thereof away from the first matrix layer, the first conductive layer and the second conductive layer are respectively received in the first groove and the second groove, the thickness of the first conductive layer is no greater than a depth of the first groove, and the thickness of the second conductive layer is no greater than a depth of the second groove.

In a preferred embodiment, the first conductive layer and the second conductive layer are conductive grids constructed by intercrossed conductive wires, the conductive grids comprise a plurality of grid units, the conductive wires of the first conductive layer are received in the first groove, the conductive wires of the second conductive layer are received in the second groove, and the width of the conductive wires ranges from 500 nm to 5 μm.

In a preferred embodiment, the conductive wires is made of one selected from the group consisting of metal, conductive polymer, grapheme, carbon nano-tube, and ITO.

In a preferred embodiment, the metal is selected form the group consisting of Au, Ag, Cu, Al, Ni and Zn, or alloy thereof.

In a preferred embodiment, the grid units are rhomboid, or rectangle, or parallelogram, or curved quadrilateral, and a projection of the center of the grid units of the second conductive layer on the first conductive layer is spaced a predetermined distance from the center of the grid units of the first conductive layer.

In a preferred embodiment, the projection of the center of the grid units of the second conductive layer on the first conductive layer is spaced a distance between $1/3a$ and $\sqrt{2}a/2$ from the center of the grid units of the first conductive layer, and "a" is the side length of the grid units.

In a preferred embodiment, projections on the first conductive layer of connecting lines of centers of the grid units in the same arrangement direction on the second conductive layer are misaligned with connecting lines of centers of the grid units in the same arrangement direction on the first conductive layer.

In a preferred embodiment, the conductive film further comprises:
   a first tackifier layer configured between the substrate and the first matrix layer, the first tackifier layer being used to connect the first matrix layer and the substrate;
   a second tackifier layer located between the first matrix layer and the second matrix layer, the second tackifier layer being used to connect the first matrix layer and the second matrix layer.

In a preferred embodiment, first electrode traces and second electrode traces, the first electrode traces being embedded in the first matrix layer and electrically connected to the first conductive layer, and the second electrode traces being embedded in the second matrix layer and electrically connected to the second conductive layer.

In a preferred embodiment, the first conductive layer is divided into a plurality of mutually-insulated first gird strips, the second conductive layer is divided into a plurality of mutually-insulated second gird strips, the first electrode traces comprise a plurality of traces electrically connected to the first grid strips respectively, and the second electrode traces comprise a plurality of traces electrically connected to the second grid strips respectively.

In a preferred embodiment, a first connecting portion in a strip shape is provided on the end of a first electrode trace near to the first conductive layer, the first connecting portion has a greater width than other portion of the first electrode trace, a second connecting portion in a strip shape is provided on the end of a second electrode trace near to the second conductive layer, and the second connecting portion has a greater width than other portion of the second electrode trace.

In a preferred embodiment, the first electrode traces and the second electrode traces are constructed by mesh-intersecting conductive wires, and a grid cycle of the first electrode traces and the second electrode traces is less than a grid cycle of the first conductive layer and the second conductive layer.

In a preferred embodiment, a first electrode switching line is provided between a first electrode trace and the first conductive layer, a second electrode switching line is provided between a second electrode trace and the second conductive layer, the first switching lines and the second switching lines are consecutive conductive wires, the first switching lines are connected to the first conductive layer and ends of at least two conductive wires of the first electrode traces, and the second switching lines are connected to the second conductive layer and ends of at least two conductive wires of the second electrode traces.

According to an aspect of the present disclosure, a touch screen is provided. The touch screen comprises:

a glass panel; and the conductive film of any of the above-mentioned embodiments, a side of the second matrix layer away from the first matrix layer being bonding with the glass panel to make the conductive film be attached to the glass panel.

According to an aspect of the present disclosure, a method for manufacturing touch screen is provided. The method for manufacturing touch screen comprises steps of:

providing a substrate, the substrate including a first surface and a second surface oppositely arranged to the first surface;

coating gel on the first surface to solidify the gel to form a first matrix layer, and defining a first groove on a side of the first matrix layer away from the substrate;

filling conductive material into the first groove to form a first conductive layer;

coating gel on a side of the first matrix layer away from the substrate to solidify the gel to form a second matrix layer, and defining a second groove on the second matrix layer; and filling conductive material into the second groove to form a second conductive layer.

In a preferred embodiment, first electrode traces electrically connected to the first conductive layer are formed while filling conductive material into the first groove to form the first conductive layer, and second electrode traces electrically connected to the second conductive layer are formed while filling conductive material into the second groove to form the second conductive layer.

In a preferred embodiment, the first conductive layer and the second conductive layer are conductive grids constructed by intercrossed conductive wires, the conductive grids comprise a plurality of grid units, the conductive wires of the first conductive layer are received in the first groove, the second conductive layer and the second conductive layer are conductive grids constructed by intercrossed conductive wires, the conductive grids comprise a plurality of grid units, the conductive wires of the second conductive layer are received in the second groove, grid cycle of the first electrode traces and the second electrode traces is less than that of the first conductive layer and the second conductive layer.

In a preferred embodiment, a first electrode switching line is provided between a first electrode trace and the first conductive layer, a second electrode switching line is provided between a second electrode trace and the second conductive layer, the first switching lines and the second switching lines are consecutive conductive wires, the first switching lines are connected to the first conductive layer and ends of at least two conductive wires of the first electrode traces, and the second switching lines are connected to the second conductive layer and ends of at least two conductive wires of the second electrode traces.

Comparing to the conventional film, the conductive film has at least the following advantages.

Firstly, the conductive film has two opposite conductive layers, which are respectively the first conductive layer and the second conductive layer. Due to the capacitor formed between the first conductive layer and the second conductive layer, it just needs to attach the conductive film to the glass panel, without bonding two pieces of the conductive films. In addition, the total thickness of the first matrix layer and the second matrix layer is less than the thickness of the substrate. Therefore, a touch screen using the conductive film has a smaller thickness.

Secondly, no bonding process is needed when the conductive film is adopted to make the touch screen. Therefore, introducing impurities during bonding, and affecting appearance and performance of the touch screen is the avoided. Moreover, it simplifies the process and improves the manufacturing efficiency, using the conductive film to manufacturing the touch screen.

DETAILED DESCRIPTION OF THE EMBODIMENTS

The disclosure is described more fully hereinafter with reference to the accompanying drawings, in which preferred embodiments of the DISCLOSURE are shown. This DISCLOSURE may, however, be embodied in many different forms and should not be construed as limited to the embodiments set forth herein. Rather, these embodiments are provided so that this disclosure will be thorough and complete.

It should be noted that, when an element is described as "fixed to" another element, it means the element can be fixed to another element directly or with a middle element. When an element is described as "connected to" another element, it means the element can be connected to another element directly or with a middle element.

Unless defined elsewhere, all the technology and science terms used herein should be with the same meaning as understood by those skilled in the art. All the terms used herein are just for the purpose of describing detailed embodiments, but not limited to the scope of the present disclosure. All the "and/or" used herein comprises one listed item, or any combination of more related listed items.

Figure 1:
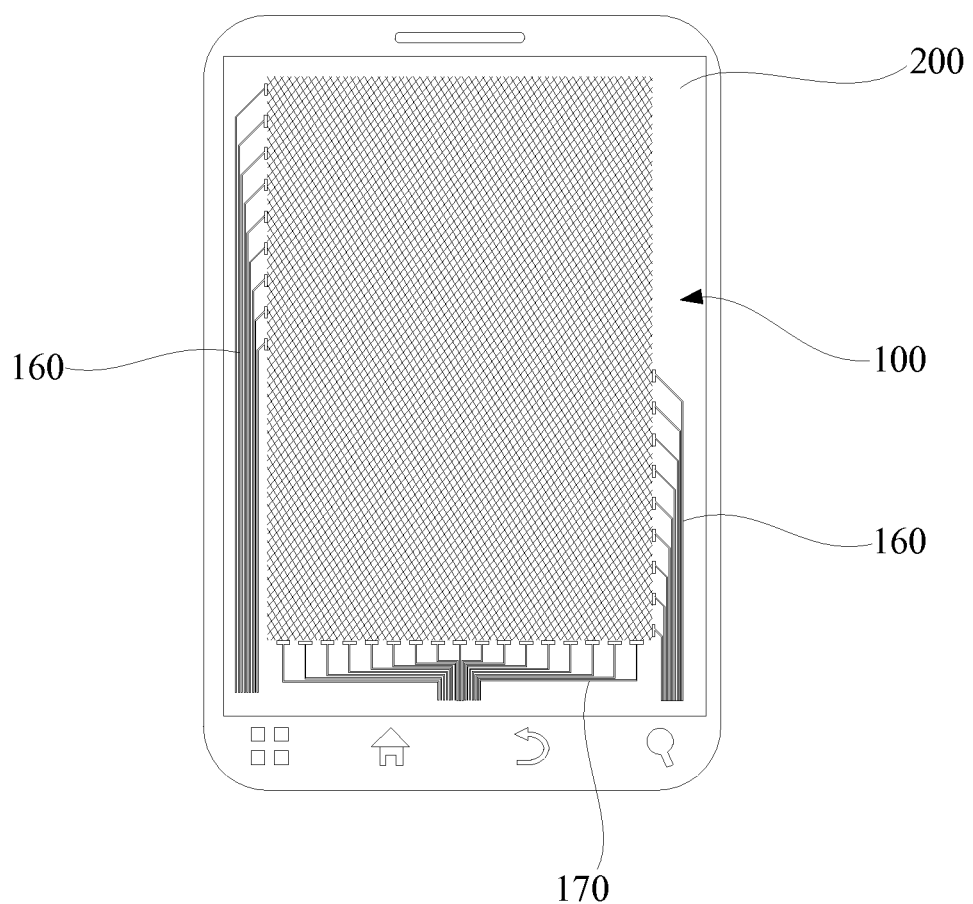
FIG. 1 is a schematic view of a preferred embodiment of a touch screen according to the present disclosure.
Figure 2:
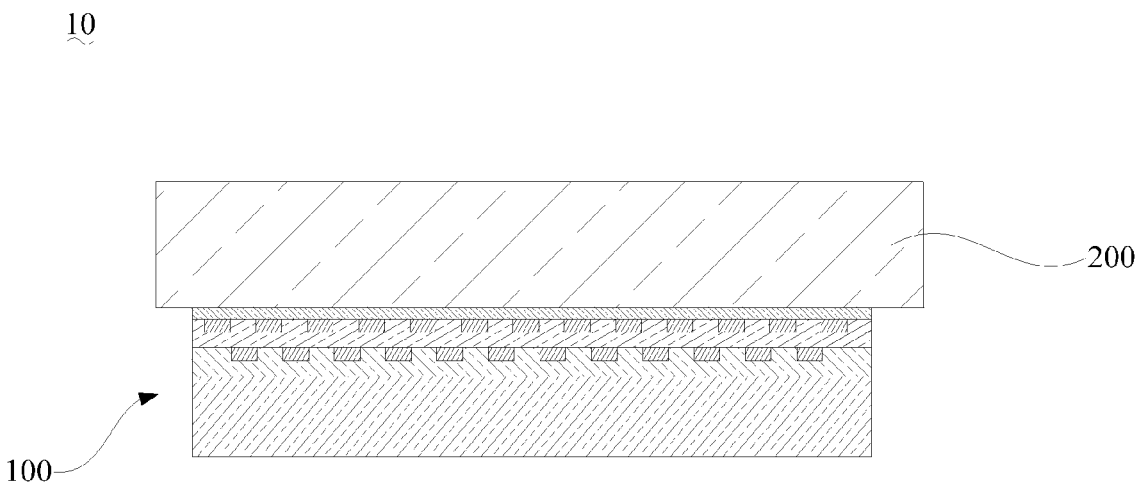
FIG. 2 is a schematic view of layer structures of the touch screen in FIG. 1.

Referring to FIG. 1 and FIG. 2, a touch screen 10 according to a preferred embodiment of the present disclosure includes a conductive film 100 and a glass panel 200. The conductive film 100 is attached to the glass panel 200.

Figure 3:
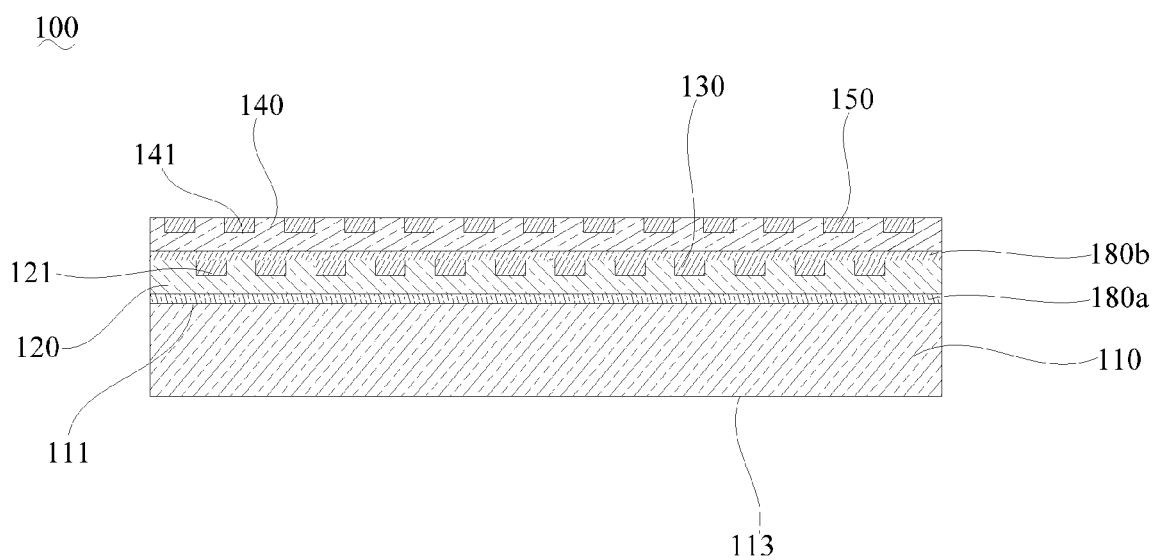
FIG. 3 is a schematic view of layers of the conductive film in FIG. 2.

Referring also to FIG. 3, the conductive film 100 includes a substrate 110, a first matrix layer 120, a first conductive layer 130, a second matrix layer 140, a second conductive layer 150, first electrode traces 160, second electrode traces 170, a first tackifier layer 180a, and a second tackifier layer 180b.

The substrate 110 comprises a first surface 111 and a second surface 113, the first surface 111 and the second surface 113 being oppositely configured. In the present embodiment, the substrate 110 is a film of insulating material polyethylene terephthalate (PET). It should be pointed out that, in alternative embodiments, the substrate 110 may be a film of other materials, such as polybutylene terephthalate (PBT), polymethylmethacrylate (PMMA), polycarbonate (PC), glass, and etc. When the conductive film 100 is applied to a touch screen, the material for the substrate 110 is optimal to be transparent insulating material.

The first matrix layer 120 is attached to the first surface 111 of the substrate 110. The first matrix layer 120 is formed by solidifying the gel coated on the first surface 111, and it thus has a less thickness than that of the substrate 110. In addition, the first matrix layer 120 is made from transparent insulating material which is different from the material of the substrate 110.

In the present embodiment, the gel for forming the first matrix layer 120 is solvent-free UV-curing acrylic resin. In alternative embodiments, the gel for forming the first matrix layer 120 may be other light-curing adhesive, heat-curing adhesive, and self-curing adhesive. The light-curing adhesive may be a mixture of prepolymer, monomer, photoinitiator, and additive, in molar ration of 30~50%, 40~60%, 1~6%, and 0.2~1%. The prepolymer is at least one of epoxy acrylate, polyurethane acrylate, polyether acrylates, polyester acrylate, and acrylic resin; the monomer is at least one of monofunctional (IBOA, IBOMA, HEMA, and etc.), bifunctional (TPGDA, HDDA, DEGDA, NPGDA and etc.), trifunctional, and multifunctional (TMPTA, PETA and etc.); the photoinitiator is benzophenone, desoxybenzoin, or etc. Furthermore, additive in molar ration of 0.2~1% can be added into the mixture. The additive may be hydroquinone, or p-methoxyphenol, or benzoquinone, or 2,6-di-tert-butyl-cresol, or etc.

The first conductive layer 130 is embedded in the first matrix layer 120. A thickness of the first conductive layer 130 is less than that of the first matrix layer 120. The first matrix layer 120 prevents the first conductive layer 130 from being damaged in the subsequent process. Further, one of the surfaces of the first matrix layer 120 being away from the substrate has relatively small concaves and convexes, which makes subsequent coating procedure easier.

Figure 6:
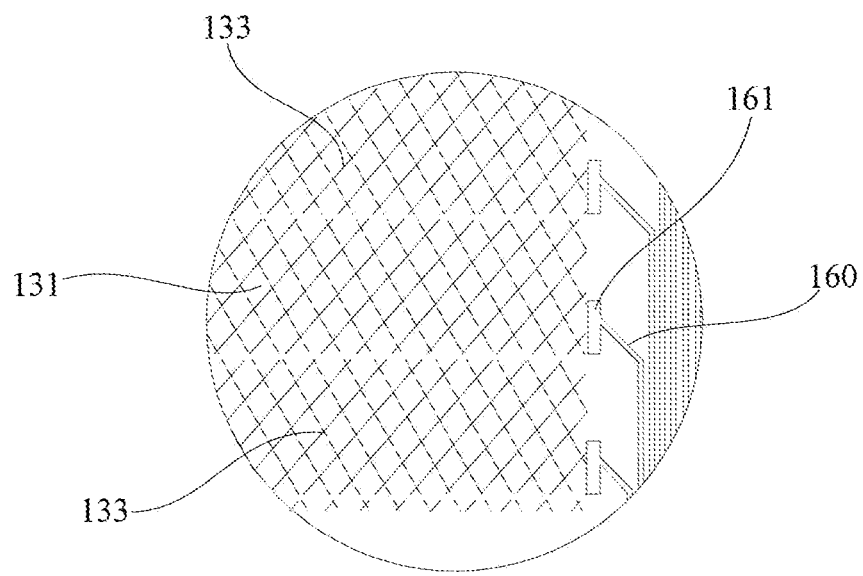
FIG. 6 is a partially, enlarged schematic view of a first conductive layer of the conductive film in FIG. 2.

Referring also to FIG. 6, in the present embodiment, a first groove 121 is defined in the first matrix layer 120. A depth of the first groove 121 is greater than a thickness of the first conductive layer 130. The first conductive layer is received in the first groove 121. In alternative embodiments, the thickness of the first conductive layer 130 may be equal to the depth of the first groove 121.

Further, the first conductive layer 130 is a conductive grid constructed by inter-crossed metal wires. The conductive grid has a plurality of grid units. The grid units of the first conductive layer 130 are defined as the first conductive grid units 131. In alternative embodiments, it should be pointed out that, the first conductive layer 130 is not limited to the conductive grid constructed by inter-crossed metal wires, and may be wires of other conductive material, such as conductive polymer, grapheme, carbon nano-tube, Indium tin oxide (ITO), and etc.

The second matrix layer 140 is attached to a side of the first matrix layer 120 being away from the substrate 110. The second matrix layer 140 is formed by solidifying the gel coated on the first matrix layer 120. A thickness of the second matrix layer 140 is less than that of the substrate 110. In addition, a total thickness of the first matrix layer 120 and the second matrix layer 140 is less than the thickness of the substrate 110. Specifically, a side of the second matrix layer 140 being away from the first matrix layer 120 is bonding to the glass panel 200, to make the conductive film 100 bond to the glass panel 200.

In the present embodiment, the material for forming the second matrix layer 140 is the same as the material for forming the first matrix layer 120. Furthermore, the above-mentioned additive can be added into the material for forming the second matrix layer 140 as required.

The second conductive layer 150 is embedded in the second matrix layer 140. A thickness of the second conductive layer 150 is smaller than that of the second matrix layer 140. The second matrix layer 140 prevents the second conductive layer 150 from being damaged in the subsequent manufacturing process. Further, a surface of the second matrix layer 140 facing the glass panel 200 has a plurality of small concaves and convexes, which make subsequent coating easier. The second conductive layer 150 is spaced from the first conductive layer 130 by the first matrix layer 120 and the second matrix layer 140, to make the first conductive layer 130 and the second conductive layer 150 insulated from each other, forming a capacitive structure between the first conductive layer 130 and the second conductive layer 150.

Figure 7:
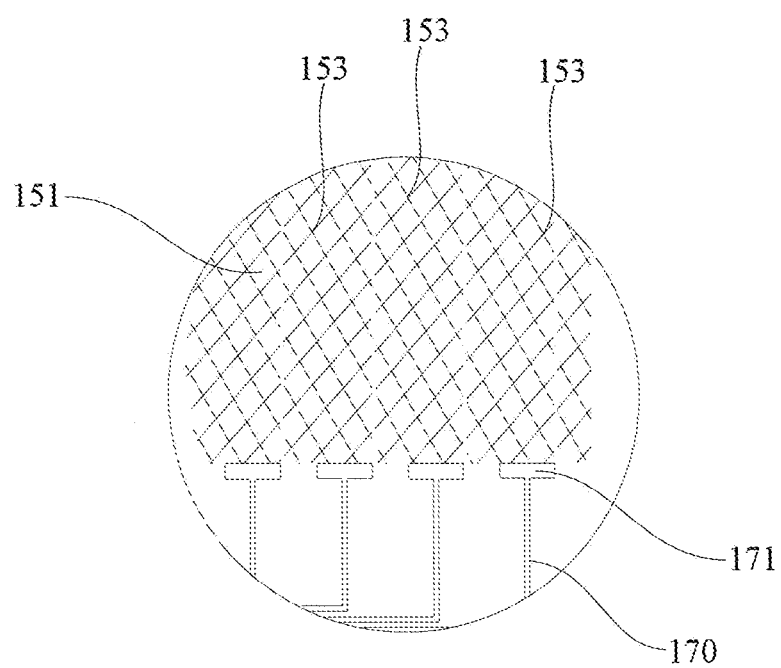
FIG. 7 is a partially, enlarged schematic view of a second conductive layer of the conductive film in FIG. 2.

Referring to FIG. 7 together, in the present embodiment, a second groove 141 is defined in a side of the second matrix layer 140 being away from the first matrix layer 120. A depth of the second groove 141 is greater than the thickness of the second conductive layer 150. The second conductive layer 150 is received in the second groove 141. Specifically, the second conductive layer 150 is a conductive grid constructed by inter-crossed metal wires. The conductive grid has a plurality of grid units. The grid units of the second conductive layer 150 are defined as the second conductive grid units 151. In alternative embodiments, what should be pointed out is, the second conductive layer 150 is not limited to the conductive grid constructed by inter-crossed metal wires, and may be wires of other conductive material, such as conductive polymer, grapheme, carbon nano-tube, Indium tin oxide (ITO), and etc.

In addition, in the present embodiment, materials for making the first conductive layer 130 and the second conductive layer 150 is selected from one of Au, Ag, Cu, Ni, Al, and Zn, or alloy of at least two of them. It should be understood that, the materials for making the first conductive layer 130 and the second conductive layer 150 is electrically conductive to implement the said functions.

Figure 4:
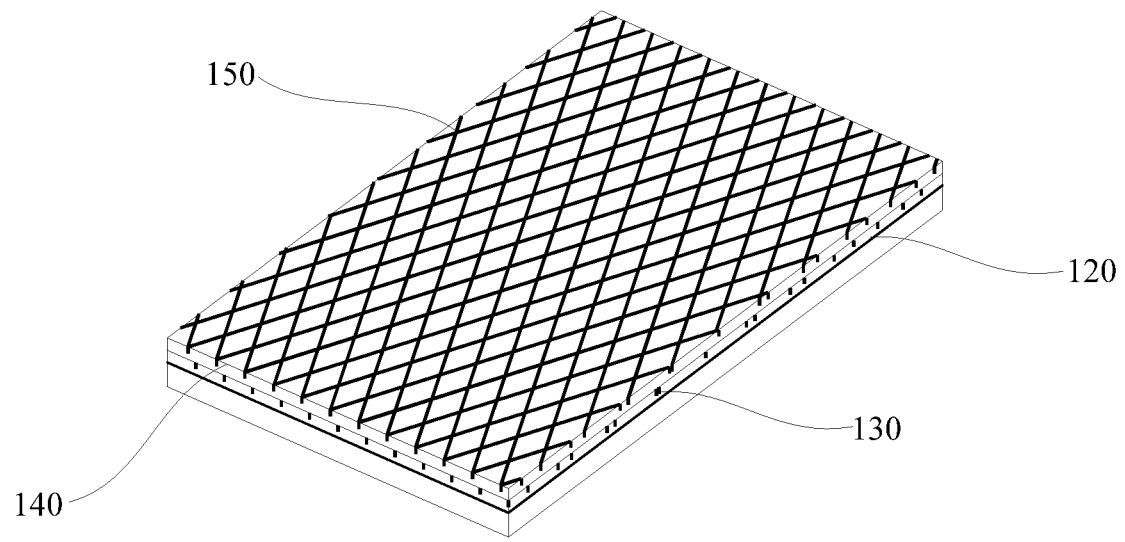
FIG. 4 is a schematic view of the conductive film in FIG. 2.
Figure 5:
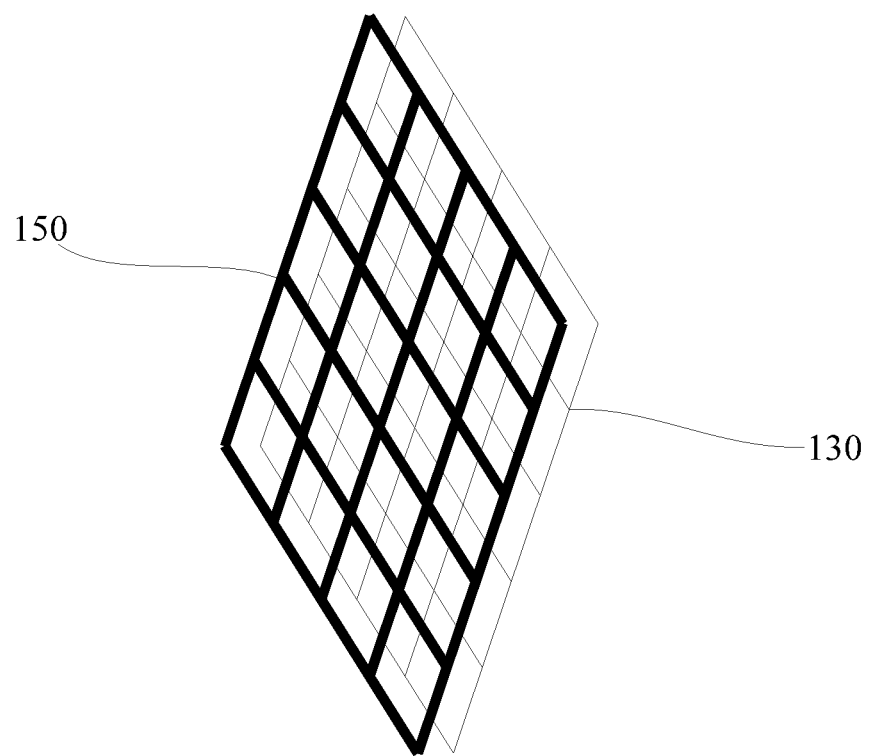
FIG. 5 is a schematic view of the conductive film in FIG. 2, viewed from another angle.

Referring also to FIG. 4 and FIG. 5, in the present embodiment, the grid units are rhombic. The center of the grid units of the second conductive layer 150 is projected on the first conductive layer 130, with the projection spaced a predetermined distance from the center of the grid units of the first conductive layer 130. Specifically in the present embodiment, the predetermined distance ranges between 1/3a and $\sqrt{2}a/2$, wherein "a" is the side length of the grid units. Therefore, the conductive wires constructing the first conductive layer 130 and the second conductive layer 150 are deviated from each other for a certain distance, to avoid serious Moire phenomenon while the conductive film 100 used in an LCD monitor. In alternative embodiments, the grid may also be rectangle, or parallelogram, or curved quadrilateral with four curved sides, two opposite sides of which are in the same shape and with the same curve trend.

Furthermore, the connecting lines of centers of the second grid units 151 in the same arrangement direction of the second conductive layer 150 are projected on the first conductive layer 130, with the projections misaligned with connecting lines of centers of the first grid units 131 in the same arrangement direction of the first conductive layer 130. Moire phenomenon is thus further reduced.

Referring also to FIG. 6 and FIG. 7, the first electrode traces 160 are embedded in the first matrix layer 120 and electrically connected to the first conductive layer 130. When the conductive film 100 is used to manufacture a touch screen of an electronic device, the first electrode traces 160 are used to electrically connect the first conductive layer 130 and the electronic device, thus enabling the controller to sense operation of the touch screen. In the present embodiment, the first electrode traces 160 are single solid conductive strips. Grooves for receiving the first electrode traces 160 are defined in the substrate 110. The first electrode traces 160 are received in the grooves. Furthermore, a first connecting portion 161 is formed on the first electrode traces 160. The first connecting portions 161 are located on ends near to the first conductive layer 130. The first connecting portions 161 have a greater width than other portions of the first electrode traces 160 with thus a larger contacting area, so that it is easier for the first electrode traces 160 to electrically connect to conductive wires of the first conductive layer 130.

In the present embodiment, both the first electrode traces 160 and the first conductive layer 130 are simultaneously formed in the grooves of the first matrix layer 120. In alternative embodiments, the first conductive layer 130 is formed on the surface of the first matrix layer 120 by screen printing or ink-jet printing, after forming the first conductive layer 130.

The second electrode traces 170 are embedded in the second matrix layer 140 and electrically connected to the second conductive layer 150. When the conductive film 100 is used to manufacture a touch screen of an electronic device, the second electrode traces 170 are used to electrically connect the second conductive layer 150 and the electronic device, thus enabling the controller to sense operation of the touch screen. In the present embodiment, the second electrode traces 170 are single solid lines. Grooves for receiving the second electrode traces 170 are defined in the substrate 110. The second electrode traces 170 are received in the grooves. Furthermore, a first connecting portion 161 is formed on a second electrode trace 170. The first connecting portions 161 are located on ends near to the second conductive layer 150. The first connecting portions 161 have a greater width than other portions of the second electrode traces 170 with thus a larger contacting area, so that it is easier for the second electrode traces 170 to electrically connect to conductive wires of the second conductive layer 150.

In the present embodiment, both the first electrode traces 160 and the second conductive layer 150 are formed in the grooves of the second matrix layer 140. In alternative embodiments, the second conductive layer 150 is formed on the surface of the second matrix layer 140 by screen printing or ink-jet printing, after forming the second conductive layer 150.

Figure 8:
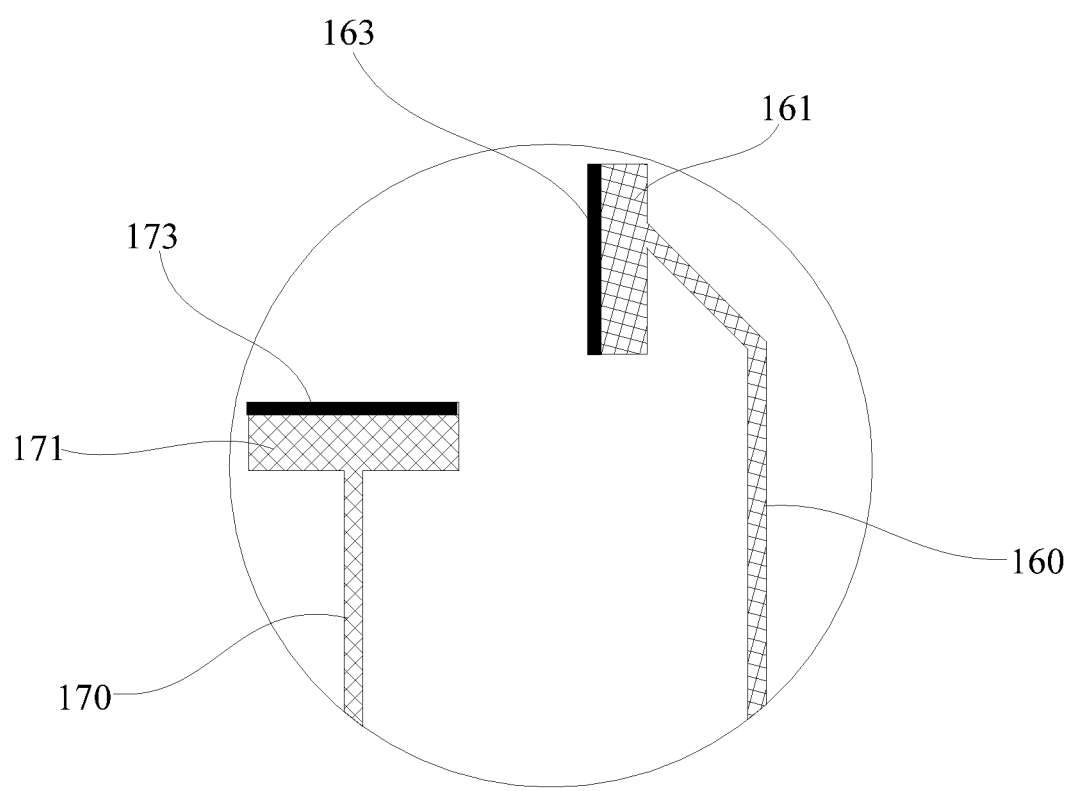
FIG. 8 is a partially, enlarged schematic view of first electrode traces and second electrode traces of a conductive film according to another preferred embodiment of the present disclosure.

Referring to FIG. 8 together, in another embodiment, the first electrode traces 160 and the second electrode traces 170 are constructed by mesh-intersecting conductive wires. The first electrode traces 160 and the second electrode traces 170 respectively have consecutive first electrode switching lines 163 and consecutive second electrode switching lines 173, which are both consecutive metal wires.

The grids cycle of the first electrode traces 160 and the second electrode traces 170 are different from girds cycle of the first conductive layer 130 and the second conductive layer 150, wherein the grids cycle means the size of the grid unit. The grid cycle of the first electrode traces 160 and the second electrode traces 170 are less than the grid cycle of the first conductive layer 130 and the second conductive layer 150. Therefore, it may be difficult to align when electrically connecting the first electrode traces 160 and the second electrode traces 170 to the first conductive layer 130 and the second conductive layer 150. The first connecting portions 161 and the second connecting portions 171 are formed and connected to the first conductive layer 130 and the second conductive layer 150 respectively via the first electrode switching lines 163 and the second electrode switching lines 173. The first electrode switching lines 163 and the second electrode switching lines 173 are consecutive metal wires, so that, the first electrode switching lines 163 can connect to ends of at least two conductive wires of the first conductive layer 130 and the first electrode traces 160, and the second electrode switching lines 173 can connect to ends of at least two conductive wires of the second conductive layer 150 and the second electrode traces 170. Therefore, the first electrode switching lines 163 and the second electrode switching lines 173 can resolve the difficulty of aligning conductive wires in different grid cycles, thus making it easier for the first electrode traces 160 and the second electrode traces 170 to electrically connect to the first conductive layer 130 and the second conductive layer 150.

In order to highlight the first electrode switching lines 163 and the second electrode switching lines 173 in the figure, the first electrode switching lines 163 and the second electrode switching lines 173 are shown with a larger line width than the metal conductive wires of the first electrode traces 160 and the second electrode traces 170. It should not be understood as that, the first electrode switching lines 163 and the second electrode switching lines 173 are of a greater thickness than the metal conductive wires constructed the first electrode traces 160 and the second electrode traces 170. The thickness of the first electrode switching lines 163 and the second electrode switching lines 173 can be determined according to application environment in practical application.

It should be pointed out that, the first electrode traces 160 and the second electrode traces 170 can be omitted in alternative embodiments. When manufacturing the touch screen, external traces can be employed to extract the first conductive layer 130 and the second conductive layer 150.

In the present embodiment, the first conductive layer 130 includes a plurality of mutually-insulated first gird strips 133, and the second conductive layer 150 includes a plurality of mutually-insulated second gird strips 153. The first electrode traces 160 include a plurality of traces electrically connected to the first gird strips 133 respectively. The second electrode traces 170 include a plurality of traces electrically connected to the second grid strips 153 respectively. Specifically, the conductive wires of the first conductive layer 130 are cut off in a particular direction, forming a plurality of parallel first grid strips 133. The first grid strips 133 may be used as driving grid strip in practical application. The conductive wires of the second conductive layer 150 are cut off in a particular direction, forming a plurality of parallel second grid strips 153. The second grid strips 153 may be used as sensing grid strip in practical application.

The first tackifier layer 180a is configured between the substrate 110 and the first matrix layer 120. The first tackifier layer 180a is used to connect the first matrix layer 120 and the substrate 110. The first tackifier layer 180a is formed by adhesive coated on the first surface 111, so the first tackifier layer 180a plays the role of increasing adhesive strength between the first matrix layer 120 and the substrate 110. Specifically in the present embodiment, the adhesive for forming the first tackifier layer 180a can be selected from one of epoxy resin, epoxy silane, and polyimide resin.

The second tackifier layer 180b is located between the first matrix layer 120 and the second matrix layer 140. The second tackifier layer 180b is used to connect the first matrix layer 120 and the second matrix layer 140. The second tackifier layer 180b is formed by adhesive coated on the first matrix layer 120, so the second tackifier layer 180b plays the role of increasing adhesive strength between the first matrix layer 120 and the second matrix layer 140. In the present embodiment, the adhesive for forming the second tackifier layer 180b is the same as the adhesive for forming the first tackifier layer 180a can be selected from one of epoxy resin, epoxy silane, and polyimide resin.

It should be pointed out that, both the first tackifier layer 180a and the second tackifier layer 180b can be omitted in alternative embodiments.

Comparing to the conventional film, the conductive film 100 has at least the following advantages.

Firstly, the conductive film 100 has two opposite conductive layers, which are respectively the first conductive layer 130 and the second conductive layer 150. Due to the capacitor formed between the first conductive layer 130 and the second conductive layer 150, it just needs to attach the conductive film 100 to the glass panel 200, without bonding two pieces of the conductive films. In addition, the total thickness of the first matrix layer 120 and the second matrix layer 140 is less than the thickness of the substrate 110. Therefore, a touch screen 10 using the conductive film 100 has a smaller thickness.

Secondly, no bonding process is needed when the conductive film 100 is adopted to make the touch screen 10. Therefore, introducing impurities during bonding, and affecting appearance and performance of the touch screen 100 is the avoided. Moreover, it simplifies the process and improves the manufacturing efficiency, using the conductive film 100 to manufacturing the touch screen 10.

In addition, a method for manufacturing a conductive film is also provided by the present disclosure.

Figure 9:
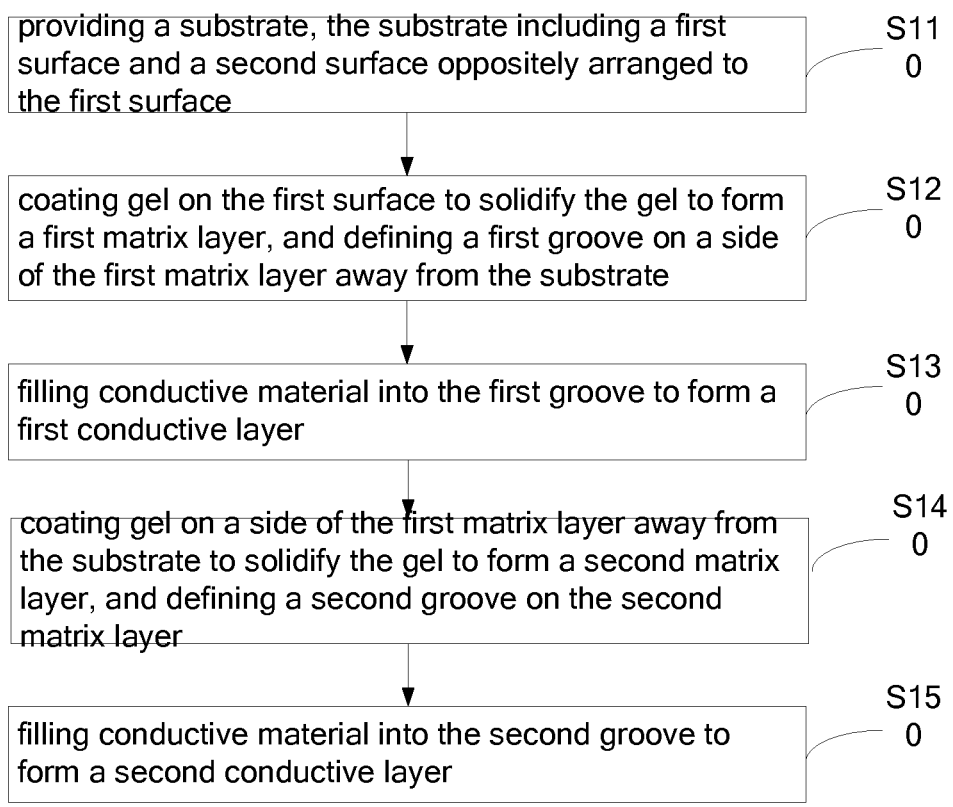
FIG. 9 is a block flow chart of an embodiment of a method for manufacturing a conductive film.
Figure 10:
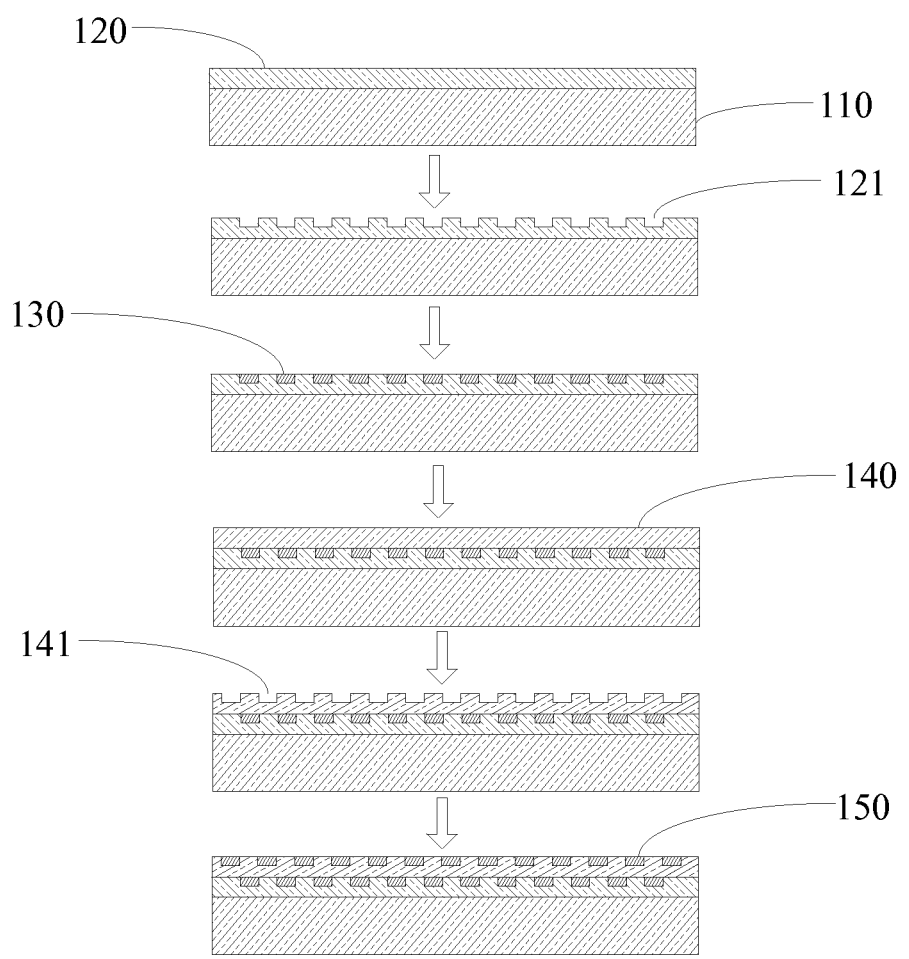
FIG. 10 is a schematic flow diagram of an embodiment of a method for manufacturing a conductive film.

Referring to FIG. 9 and FIG. 10, a method for manufacturing a conductive film according to an embodiment includes steps S110-S150.

In step S110, a substrate 110 including a first surface and a second surface opposite to the first surface is provided.

In the present embodiment, the material of the substrate 110 is polyethylene terephthalate (PET). It should be pointed out that, in alternative embodiments, the material of the substrate 110 may be other material, such as polybutylene terephthalate (PBT), polycarbonate (PC) plastic, and glass. Specifically in the present embodiment, the depth of the substrate 110 is 125 micrometers. In alternative embodiments, the depth of the substrate 110 can be changed according to actual needs.

In step S120, gel is coated on the first surface and solidified to form the first matrix layer 120. The first groove 121 is defined in the side of the first matrix layer 120 away from the substrate 110.

In the present embodiment, the gel coated on the first surface is solvent-free UV-curing acrylic resin. In alternative embodiments, the gel may be light-curing adhesive, or heat-curing adhesive, or self-curing adhesive. The light-curing adhesive may be a mixture of prepolymer, monomer, photoinitiator, and additive, in molar ration of 30~50%, 40~60%, 1~6%, and 0.2~1%. The prepolymer is at least one of epoxy acrylate, polyurethane acrylate, polyether acrylates, polyester acrylate, and acrylic resin; the monomer is at least one of monofunctional, bifunctional, trifunctional, and multifunctional; the photoinitiator is benzophenone, desoxybenzoin, or etc. Furthermore, the additive in molar ration of 0.2~1% can be added into the mixture. The additive may be hydroquinone, or p-methoxyphenol, or benzoquinone, or 2,6-di-tert-butyl-cresol, or etc.

Furthermore, the first groove 121 is formed on the side of the first matrix layer 120 away from the substrate 110 by imprinting. Specifically, the depth of the first groove 121 is 3 micrometers, and the width is 2.2 micrometers.

In step S130, conductive material is filled in the first groove 121 to form the first conductive layer 130.

In the present embodiment, the first groove 121 is in the shape of grid, and the conductive material forms intertwined conductive wires in the first groove 121, constructing a conductive grid. Specifically, nano silver ink is filled in the first groove 121 by scrapping technology, and is then sintered in the condition of 150° C. to make elemental silver of the nano silver ink be sintered into conductive wires. The solid content of the silver ink is 35%, and the solvent is volatilized during sintering.

Figure 11:
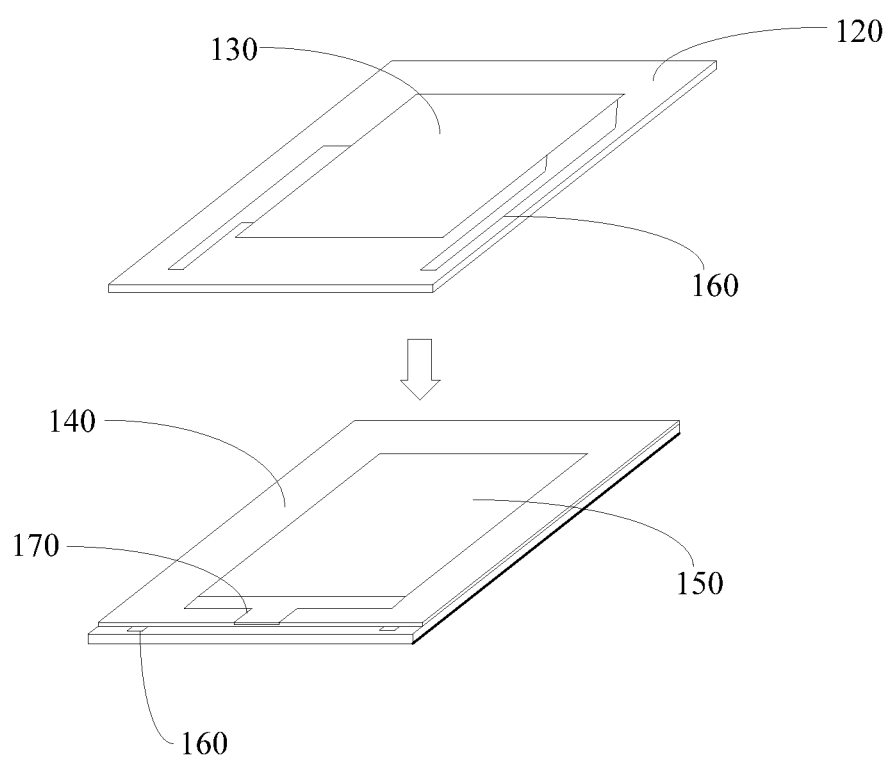
FIG. 11 is a schematic flow diagram of an embodiment of a method for forming electrode traces.

Referring also to FIG. 11, in the present embodiment, the step S130 also includes forming the first electrode traces 160 electrically connected to the first conductive layer 130.

Specifically, in the present embodiment, the first groove 121 includes a groove for receiving the first electrode traces 160. When filling conductive material into the first groove 121, the conductive material forms the first electrode traces 160 in the groove for receiving the first electrode traces 160.

In step S140, gel is coated on the side of the first matrix layer 120 away from the substrate 110 and solidified to form the second matrix layer 140. The second groove 141 is defined in the second matrix layer 140.

In the present embodiment, the material for forming the second matrix layer 140 is the same as the material for forming the first matrix layer 120. Furthermore, the above-mentioned additive can be added into the material for forming the second matrix layer 140 as required, to make the second matrix layer 140 be distinguished from the first matrix layer 120.

Further, the second groove 141 is formed on the side of the second matrix layer 140 away from the first matrix layer 120 by imprinting. Specifically, the depth of the second groove 141 is 3 micrometers, and the width is 2.2 micrometers.

In step S150, conductive material is filled in the second groove 141 to form the second conductive layer 150.

In the present embodiment, the second groove 141 is in the shape of grid, and the conductive material forms intertwined conductive wires in the second groove 141, constructing a conductive grid. Specifically, nano silver ink is filled in the second groove 141 by scrapping technology, and is then sintered in the condition of 150 to make elemental silver of the nano silver ink be sintered into conductive wires. The solid content of the silver ink is 35%, and the solvent is volatilized during sintering.

In the present embodiment, the step S150 also includes forming the second electrode traces 170 electrically connected to the second conductive layer 150.

Specifically in the present embodiment, the second groove 141 includes grooves for receiving the second electrode traces 170. When filling conductive material into the second groove 141, the conductive material forms the second electrode traces 170 in the groove for receiving the second electrode traces 170.

In the present embodiment, before the step S120, the method for manufacturing the conductive film includes a step of coating adhesive on the first surface to form a first tackifier layer.

Specifically, the first tackifier layer is formed by adhesive coated on the first surface of the substrate 110, so the first tackifier layer plays the role of increasing adhesive strength between the first matrix layer 120 and the substrate 110. Specifically in the present embodiment, the adhesive for forming the first tackifier layer can be one of epoxy resin, epoxy silane, and polyimide resin. Specifically in the present embodiment, the first matrix layer 120 is coated on the first tackifier layer.

Further, before the step S140, the method for manufacturing the conductive film includes a step of coating adhesive on the side of the first matrix layer 120 away from the substrate to form a second tackifier layer.

Specifically, the second tackifier layer is formed by adhesive coated on the first matrix layer 120, so the second tackifier layer plays the role of increasing adhesive strength between the first matrix layer 120 and the second matrix layer 140. Specifically in the present embodiment, the adhesive for forming the second tackifier layer is the same as the adhesive for forming the first tackifier layer. In addition, the second matrix layer 140 is coated on the second tackifier layer.

Comparing to the conventional method for manufacturing conductive film, the conductive film made by the above-mentioned method has two oppositely arranged conductive layers. Due to the capacitor formed between the first conductive layer 130 and the second conductive layer 150, when manufacturing a touch screen, a conductive film formed by method for manufacturing conductive film reduces the thickness of the touch screen and improving efficiency. In addition, the first groove 121 and the second groove 141 are defined by imprinting respectively on the substrate 110 and the matrix layer 130, and the first conductive layer 130 and the second conductive layer 150 are formed by filling conductive material respectively in the first groove 121 and the second groove 141, thus no coating and etching are needed to form the first conductive layer 130 and the second layer 140. Therefore, the method for manufacturing conductive layer simplifies the process and saves material.

Although the present disclosure has been specifically and detailed described with reference to the above-mentioned embodiments thereof, it should not be understood as limitation of the scope of the present disclosure. What should be pointed out is, it is apparent to those skilled in the art that a variety of modifications and changes may be made without departing from the spirit of the present disclosure. Therefore, the scope of the present disclosure is intended to be defined by the appended claims.

What is claimed is:

1. A conductive film, comprising:
    a substrate comprising a first surface and a second surface opposite to the first surface;
    a first matrix layer disposed on the first surface, the first matrix layer being formed by solidified gel coating;
    a first conductive layer embedded in the first matrix layer, a thickness of the first conductive layer being less than a thickness of the first matrix layer;
    a second matrix layer disposed on a side of the first matrix layer away from the substrate, the second matrix layer being formed by solidified gel coating; and
    a second conductive layer embedded in the second matrix layer, a thickness of the second conductive layer being less than a thickness of the second matrix layer;
    wherein the second conductive layer is insulated from the first conductive layer wherein the first conductive layer and the second conductive layer are conductive grids constructed by intercrossed conductive wires, the conductive grids comprise a plurality of grid units, the conductive wires of the first conductive layer are received in a first groove in the first matrix layer, the conductive wires of the second conductive layer are received in a second groove in the second matrix layer, and the width of the conductive wires ranges from 500 nm to 5 μm.

2. The conductive film of claim 1, wherein a total thickness of the first matrix layer and the second matrix layer is less than a thickness of the substrate, and a spacing distance between the first conductive layer and the second conductive layer is less than the thickness of the substrate.

3. The conductive film of claim 2, wherein the first matrix layer defines the first groove on a side thereof away from the substrate, the second matrix layer defines the second groove on a side thereof away from the first matrix layer, the first conductive layer and the second conductive layer are respectively received in the first groove and the second groove, the thickness of the first conductive layer is no greater than a depth of the first groove, and the thickness of the second conductive layer is no greater than a depth of the second groove.

4. The conductive film of claim 1, wherein the conductive wires is made of one selected from the group consisting of metal, conductive polymer, grapheme, carbon nano-tube, and ITO.

5. The conductive film of claim 4, wherein the metal is selected form the group consisting of Au, Ag, Cu, Al, Ni and Zn, or alloy thereof.

6. The conductive film of claim 1, wherein the grid units are rhomboid, or rectangle, or parallelogram, or curved quadrilateral, and a projection of the center of the grid units of the second conductive layer on the first conductive layer is spaced a predetermined distance from the center of the grid units of the first conductive layer.

7. The conductive film of claim 6, wherein the projection of the center of the grid units of the second conductive layer on the first conductive layer is spaced a distance between 1/3a and $\sqrt{2}a/2$ from the center of the grid units of the first conductive layer, and "a" is the side length of the grid units.

8. The conductive film of claim 6, wherein projections on the first conductive layer of connecting lines of centers of the grid units in the same arrangement direction on the second conductive layer are misaligned with connecting lines of centers of the grid units in the same arrangement direction on the first conductive layer.

9. The conductive film of claim 1, further comprising:
a first tackifier layer configured between the substrate and the first matrix layer, the first tackifier layer being used to connect the first matrix layer and the substrate;
a second tackifier layer located between the first matrix layer and the second matrix layer, the second tackifier layer being used to connect the first matrix layer and the second matrix layer.

10. The conductive film of claim 1, further comprising first electrode traces and second electrode traces, the first electrode traces being embedded in the first matrix layer and electrically connected to the first conductive layer, and the second electrode traces being embedded in the second matrix layer and electrically connected to the second conductive layer.

11. The conductive film of claim 10, wherein the first conductive layer is divided into a plurality of mutually-insulated first gird strips, the second conductive layer is divided into a plurality of mutually-insulated second gird strips, the first electrode traces comprise a plurality of traces electrically connected to the first grid strips respectively, and the second electrode traces comprise a plurality of traces electrically connected to the second grid strips respectively.

12. The conductive film of claim 11, wherein a first connecting portion in a strip shape is provided on the end of a first electrode trace near to the first conductive layer, the first connecting portion has a greater width than other portion of the first electrode trace, a second connecting portion in a strip shape is provided on the end of a second electrode trace near to the second conductive layer, and the second connecting portion has a greater width than other portion of the second electrode trace.

13. The conductive film of claim 10, wherein the first electrode traces and the second electrode traces are constructed by mesh-intersecting conductive wires, and a grid cycle of the first electrode traces and the second electrode traces is less than a grid cycle of the first conductive layer and the second conductive layer.

14. The conductive film of claim 13, wherein a first electrode switching line is provided between a first electrode trace and the first conductive layer, a second electrode switching line is provided between a second electrode trace and the second conductive layer, the first switching lines and the second switching lines are consecutive conductive wires, the first switching lines are connected to the first conductive layer and ends of at least two conductive wires of the first electrode traces, and the second switching lines are connected to the second conductive layer and ends of at least two conductive wires of the second electrode traces.

15. A touch screen, comprising:
a glass panel; and
the conductive film of claim 1, a side of the second matrix layer away from the first matrix layer being bonding with the glass panel to make the conductive film be attached to the glass panel.

16. A method for manufacturing touch screen, comprising steps of:
providing a substrate, the substrate including a first surface and a second surface oppositely arranged to the first surface;
coating gel on the first surface to solidify the gel to form a first matrix layer, and defining a first groove on a side of the first matrix layer away from the substrate;
filling conductive material into the first groove to form a first conductive layer;
coating gel on a side of the first matrix layer away from the substrate to solidify the gel to form a second matrix layer, and defining a second groove on the second matrix layer; and
filling conductive material into the second groove to form a second conductive layer
wherein the second conductive layer is insulated from the first conductive layer, wherein the first conductive layer and the second conductive layer are conductive grids constructed by intercrossed conductive wires, the conductive grids comprise a plurality of grid units, and the width of the conductive wires ranges from 500 nm to 5 μm.

17. The method for manufacturing touch screen of claim 16, wherein first electrode traces electrically connected to the first conductive layer are formed while filling conductive material into the first groove to form the first conductive layer, and second electrode traces electrically connected to the second conductive layer are formed while filling conductive material into the second groove to form the second conductive layer.

18. The method for manufacturing touch screen of claim 17, wherein a grid cycle of the first electrode traces and the second electrode traces is less than that of the first conductive layer and the second conductive layer.

19. The method for manufacturing touch screen of claim 18, wherein a first electrode switching line is provided between a first electrode trace and the first conductive layer, a second electrode switching line is provided between a second electrode trace and the second conductive layer, the first switching lines and the second switching lines are consecutive conductive wires, the first switching lines are connected to the first conductive layer and ends of at least two conductive wires of the first electrode traces, and the second switching lines are connected to the second conductive layer and ends of at least two conductive wires of the second electrode traces.

* * * * *